United States Patent
Matsumoto et al.

(10) Patent No.: US 7,102,427 B2
(45) Date of Patent: Sep. 5, 2006

(54) AMPLIFIER AND RADIO FREQUENCY POWER AMPLIFIER USING THE SAME

(75) Inventors: Hidetoshi Matsumoto, Kokubunji (JP); Tomonori Tanoue, Machida (JP); Masami Ohnishi, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/922,146

(22) Filed: Aug. 20, 2004

(65) Prior Publication Data
US 2005/0046474 A1    Mar. 3, 2005

(30) Foreign Application Priority Data
Aug. 29, 2003  (JP)  ............... 2003-305657
Jun. 23, 2004  (JP)  ............... 2004-184669

(51) Int. Cl.
*H03F 3/38* (2006.01)
*H03G 3/20* (2006.01)
(52) U.S. Cl. .................. 330/10; 330/136; 330/297
(58) Field of Classification Search ................ 330/10, 330/124 R, 297, 127, 129, 136
See application file for complete search history.

(56) References Cited

U.S. PATENT DOCUMENTS

| 6,084,468 A | 7/2000 | Sigmon et al. |
| 6,175,273 B1 * | 1/2001 | Sigmon et al. ............... 330/10 |
| 6,710,649 B1 * | 3/2004 | Matsumoto et al. .... 330/124 R |

* cited by examiner

*Primary Examiner*—Khanh Van Nguyen
(74) *Attorney, Agent, or Firm*—Antonelli, Terry, Stout and Kraus, LLP.

(57) ABSTRACT

An amplifier using a wide band, high efficiency, and low distortion amplifier free from clipping distortion, and a high efficiency and low distortion radio frequency power amplifier, using that amplifier, which can be applied to wide band wireless communication systems are provided. The amplifier has a DC—DC converter 2, augmented with a low pass filter 4, for amplifying the low frequency components of an input signal from a terminal 5, and a class B amplifier, augmented with a high pass filter, for amplifying the input signal and supplying its high frequency components after amplification. The DC—DC converter and the class B amplifier are connected in parallel, and the power supply voltage of the class B amplifier is controlled with the low frequency components of the input signal.

20 Claims, 10 Drawing Sheets

AMPLIFIER AND RADIO FREQUENCY POWER AMPLIFIER USING THE SAME

CLAIM OF PRIORITY

The present application claims priority from Japanese applications JP 2003-305657 filed on Aug. 29, 2003 and JP 2004-184669 filed on Jun. 23, 2004, the contents of which are hereby incorporated by reference into this application.

FIELD OF THE INVENTION

The present invention relates to a radio frequency power amplifier, and more particularly to a radio frequency power amplifier that can be suitably applied to the transmitter unit of a radio apparatus, such as a cellular phone.

BACKGROUND OF THE INVENTION

Cellular phones have come into rapidly expanding use in recent years, resulting in a dramatic increase in the quantity of data communicated. For this reason, high capacity communication systems, such as the wideband code division multiple access (W-CDMA) system, are increasingly introduced for use.

A radio frequency power amplifier for use in the transmitter unit of a cellular phone terminal consumes more power than most other constituent elements of the terminal, and enhancing its efficiency is an essential requirement for extending the battery life. Further for use in a high capacity communication system, such as W-CDMA, reducing its distortion is indispensable along with enhancing the efficiency.

However, a class A or B amplifier normally used in a radio frequency power amplifier cannot achieve a high efficiency and a low distortion at the same time. A class A or B amplifier, when its output is low, is susceptible to little distortion but inefficient because of its linear action and, when its output is high, is efficient but susceptible to much distortion because it operates near or in saturation.

As a power amplifier that can achieve high frequency and low distortion at the same time, for instance an envelope elimination and restoration (EER) type amplifier is disclosed in U.S. Pat. No. 6,084,468, and is thereby made known to the public. One example of EER type amplifier described in the reference is shown in FIG. 11.

A radio frequency signal inputted into an input terminal 107 is distributed by a power divider 101 to an envelope detector 102 and a time delay element 104. The envelope detector 102 detects the envelope of the radio frequency signal. This envelope is amplified by an envelope amplifier 103, and supplied to the power supply terminal of a carrier amplifier 106. The time delay element 104 compensates for time delays in the envelope detector 102 and the envelope amplifier 103. The output signal of the time delay element 104 is subjected to amplitude limitation by a limiter 105 and amplified by the carrier amplifier 106.

The envelope of the radio frequency signal is once lost in the limiter 105, but as the envelope is supplied to the power supply terminal of the carrier amplifier 106, the lost envelope is restored by the carrier amplifier 106. Since the EER type amplifier is so designed that the carrier amplifier 106 always operates near or in saturation without depending on input power, it is highly efficient irrespective of whether the output is low or high. The problem of distortion, which is a disadvantage of operation near or in saturation, is solved by this recovery of the envelope of the radio frequency signal by the carrier amplifier 106, and a relatively distortion-free high power radio frequency signal is obtained at an output terminal 108.

In order to make the EER type amplifier highly efficient and relatively free from distortion, the efficiency should be enhanced and the distortion reduced not only of the carrier amplifier 106 but also of the envelope amplifier 103. An envelope signal, though lower in frequency of the carrier of radio frequency signals, in a wide band system such as W-CDMA, even the envelope has a wide frequency band, extending over a few MHz.

On the other hand, a DC—DC converter frequently used in the envelope amplifier 103 has a frequency band of at most 100 kHz or so, and accordingly the DC—DC converter cannot be directly used in the envelope amplifier 103 of a wide band system such as W-CDMA.

An example of envelope amplifier 103 disclosed in U.S. Pat. No. 6,084,468 is shown in FIG. 12. In this example of the prior art, parallel connection of a class S modulator 21 and a class B amplifier 3 is used. An envelope signal inputted to a terminal 5 is separated by a low pass filter 1 and a high pass filter 31 into low frequency components and high frequency components. The low frequency components are amplified by the class S modulator 21, while the high frequency components are amplified by the class B amplifier 3. The low frequency components and the high frequency components are synthesized after having passed a low pass filter 22 and a high pass filter 4, respectively, and a high power envelope signal is outputted to an output terminal 6.

The class S modulator 21 and the low pass filter 22, constituting a DC—DC converter, are highly efficient but narrow in bandwidth. On the other hand, the class B amplifier 3 is large in bandwidth but poor in efficiency. Therefore, by connecting the class S modulator 21 and the class B amplifier 3 in parallel, the overall bandwidth and high efficiency are attained.

Further in this example of the prior art, in order to enhance the efficiency of the class B amplifier 3, a power supply circuit consisting of a peak detector 32 and a regulator 33 is added. In this power supply circuit, the peak detector 32 detects the peak level of high frequency components and, by controlling the regulator 33 with this peak level, the power supply voltage to the class B amplifier 3 is minimized to enhance the efficiency of the class B amplifier 3.

SUMMARY OF THE INVENTION

The above-described envelope amplifier 103, though large in bandwidth and highly efficient, is still insufficient for amplifying the envelope signals of W-CDMA having a wide frequency band. When envelope signals extending over a few MHz are inputted as will be explained below, the power supply circuit consisting of the peak detector 32 and the regulator 33 will become unable to comply with peak level variations of high frequency components, and the class B amplifier 3 will suffer clipping distortion.

FIG. 13 shows an envelope signal of W-CDMA, and FIG. 14, its high frequency components. Whereas the high frequency components have peaks at sub-microsecond intervals, the peak levels irregularly fluctuate. In such a case, in order for the power supply circuit according to the prior art to operate normally, the regulator 33 should respond in a short period of time in the sub-microsecond order.

Though it is reasonable to use a DC—DC converter for the regulator 33 to meet the requirement of high efficiency, a DC—DC converter, even a high speed one, has a time constant of around 10 microseconds, and accordingly cannot respond in a short period of time in the sub-microsecond order. As a result, the output of the power supply circuit is smoothed with the time constant of the DC—DC converter.

In the graph of FIG. 14, the output voltages of the power supply circuit according to the prior art are superposed. Since the class B amplifier 3 in this example of the prior art requires a positive power supply and a negative power supply, the output voltages of the respectively corresponding power supply circuits are shown. Large signal peaks surpass the output voltages of the power supply circuits. Since the output voltage of the class B amplifier cannot surpass the power supply voltage in actual circuit operation, the envelope amplifier 103 gives rise to clipping distortion at high signal peaks.

An object of the present invention is to realize a wide band, high efficiency and low distortion amplifier free from clipping distortion, and a high efficiency and low distortion radio frequency power amplifier applicable to wide band wireless communication systems using the same.

Thus, an amplifier according to the invention for achieving the object stated above is provided with a DC—DC converter for amplifying the low frequency components of an input signal, and a class B amplifier for amplifying the input signal and outputting the amplified high frequency components, wherein the DC—DC converter and the class B amplifier are connected in parallel, and the power supply voltage of the class B amplifier are controlled with the low frequency components.

The invention makes use of the knowledge that, where the input signal is an envelope for instance, as will be described in detail afterwards, the ratio between the peak voltage of the envelope and the low frequency components of the envelope is substantially unchangeable, and that ratio is a constant unique to a given wireless communication system. Therefore in this case, according to the invention, the power supply voltage of the class B amplifier is controlled with the low frequency components of the envelope, having a certain ratio to that peak voltage, and the amplifier according to the invention is enabled to amplify the envelope without giving rise to clipping of that upper limit of the envelope. A wide band, high efficiency and low distortion amplifier free from clipping distortion is thereby realized, and a high efficiency and low distortion radio frequency power amplifier applicable to wide band wireless communication systems using the same is therefore made available Incidentally, it is preferable to so control the power supply voltage of the class B amplifier as to maintain a certain ratio to the low frequency components of the input signal. Furthermore, this ratio should preferably be substantially equal to the peak factor of the wireless communication system which uses the amplifier.

These and other objects and many of the attendant advantages of the invention will be readily appreciated, as the same becomes better understood by reference to the following detailed description when considered in connection with the accompanying drawings.

DETAILED DESCRIPTION OF THE PREFERRED EMBODIMENTS

An amplifier pertaining to the present invention and a radio frequency power amplifier using the same will be described in further detail below with reference to a number of preferred embodiments of the invention illustrated in accompanying drawings. The same reference signs in FIG. 1, FIG. 3 through FIG. 5 and FIG. 7 through FIG. 10 denote respectively the same or like elements.

Figure 1:
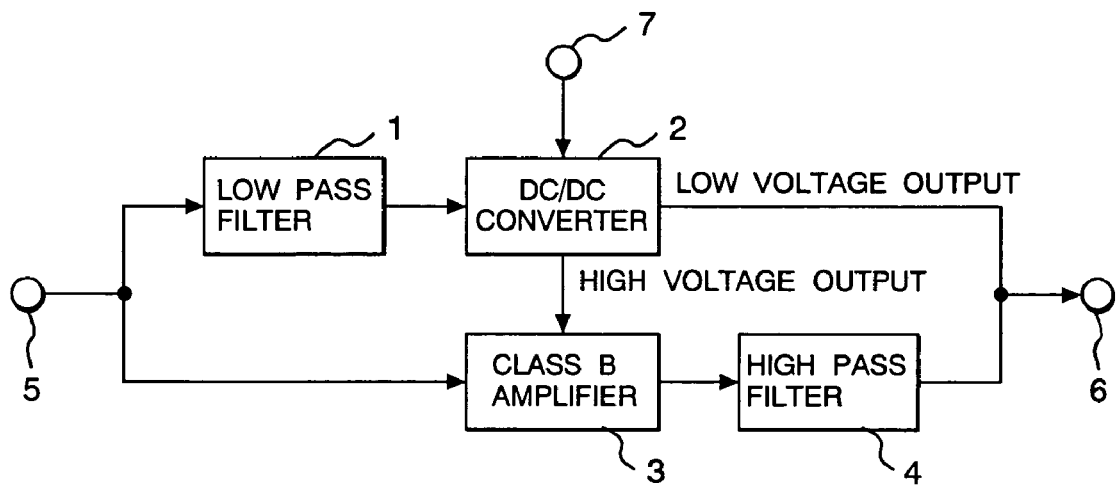
FIG. 1 is a configurational diagram illustrating an amplifier, which is a first preferred embodiment of the present invention.

The amplifier, which is the first preferred embodiment of the invention, is shown in FIG. 1. In FIG. 1, reference numeral 1 denotes a low pass filter for removing the high frequency components, namely the envelope, of an input signal inputted into an input terminal 5; 2, a DC—DC converter for amplifying the output signal of the low pass filter 1; 3; a class B amplifier for amplifying the envelope from the input terminal 5; and 4, a high pass filter for removing the low frequency components of the class B amplifier 3. The DC—DC converter 2 has two output terminals, of which one is connected to the output terminal 6 of the amplifier and the other, to the power supply terminal of the class B amplifier 3. The output terminal of the high pass filter 4 is connected to the output terminal 6.

In this embodiment of the invention, the DC—DC converter 2 for amplifying the output signal of the low pass filter 1 generates two kinds of output signals whose voltage gains differ by the peak factor multiple. This peak factor (peak to average ratio) will be explained in detail afterwards. A low voltage output whose voltage gain is smaller is supplied to the output terminal 6. A high voltage output whose voltage gain is greater is supplied to the class B amplifier 3 as power supply. The class B amplifier 3 amplifies the input signal from the input terminal 5. The voltage gain of the class B amplifier 3 is equal to the voltage gain of the low voltage output of the DC—DC converter 2.

Figure 12:
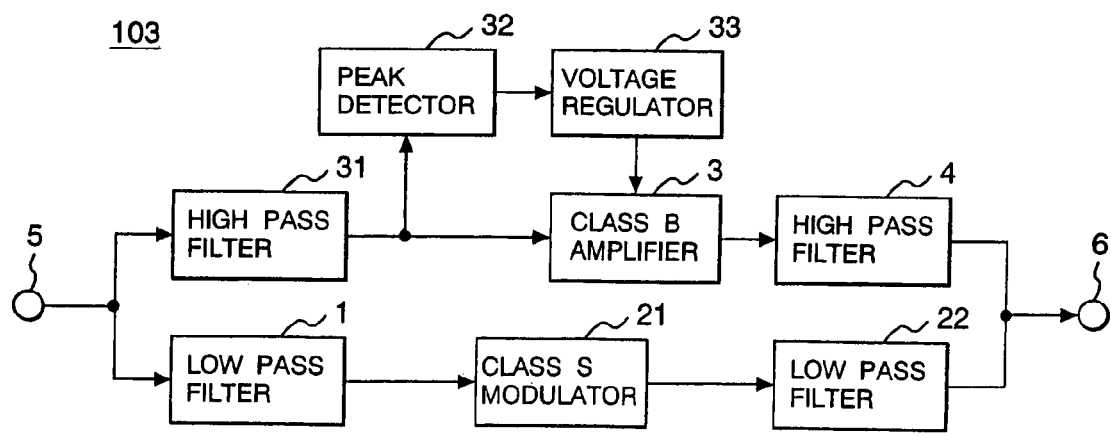
FIG. 12 is a configurational diagram illustrating an envelope amplifier using the radio frequency power amplifier of FIG. 11.

Since the amplifier according to the invention, namely envelope amplifier, like the example of the prior art shown in FIG. 12, uses parallel connection of the DC—DC converter 2 and the class B amplifier 3 to amplify the low frequency components of the envelope signal with the DC—DC converter 2 and to amplify the high frequency components with the class B amplifier 3, its band is wide and its efficiency is high.

However, the amplifier according to the invention used as the envelope amplifier differs from the example of the prior art shown in FIG. 12 in the way the power supply voltage of the class B amplifier 3 is controlled. The example of the prior art, as it controls the power supply voltage of the class B amplifier 3 by using the peak voltage of the high frequency components of the envelope signal as described above, it involves the problem of clipping distortion. According to the present invention, as will be described below, the efficiency of the class B amplifier 3 is enhanced without allowing clipping distortion to arise by controlling the power supply voltage of the class B amplifier 3 by using the low frequency components of the envelope signal.

Figure 13:
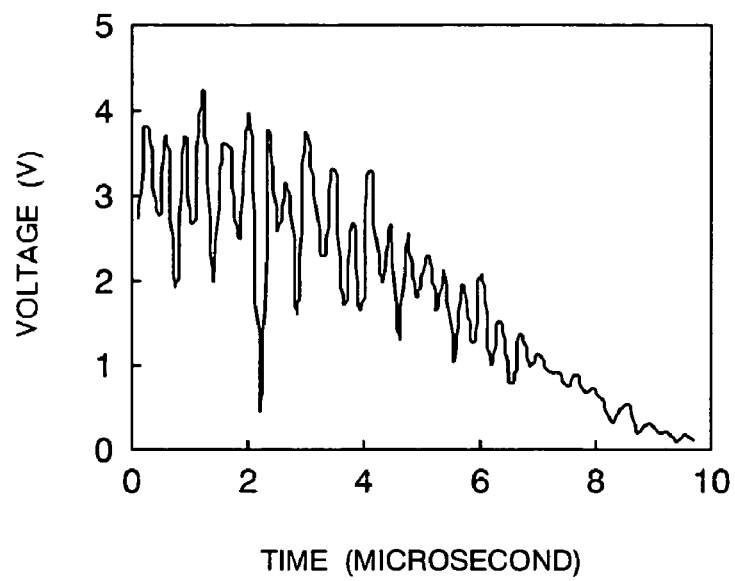
FIG. 13 illustrates a W-CDMA envelope signal.
Figure 14:
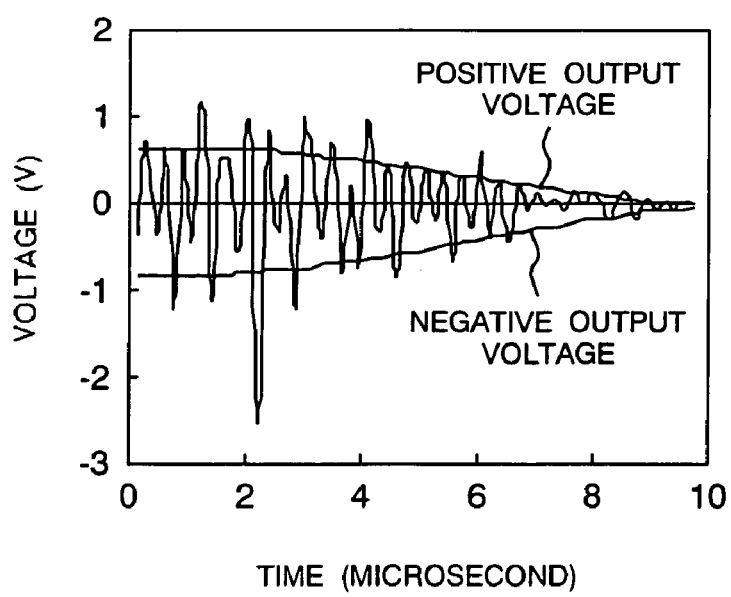
FIG. 14 illustrates high frequency components of the W-CDMA envelope signal.

The present invention makes use of the unique characteristic of wide band wireless communication systems that the peak voltage of the envelope signal is correlated to the average voltage of the envelope signal. As shown in FIG. 13, the envelope signal irregularly rises or falls. However, its voltage does not infinitely rise, but there is a certain peak voltage that is not surpassed. This peak voltage is in a proportional relationship to the low frequency components, namely the average voltage of the envelope signal.

Figure 2:
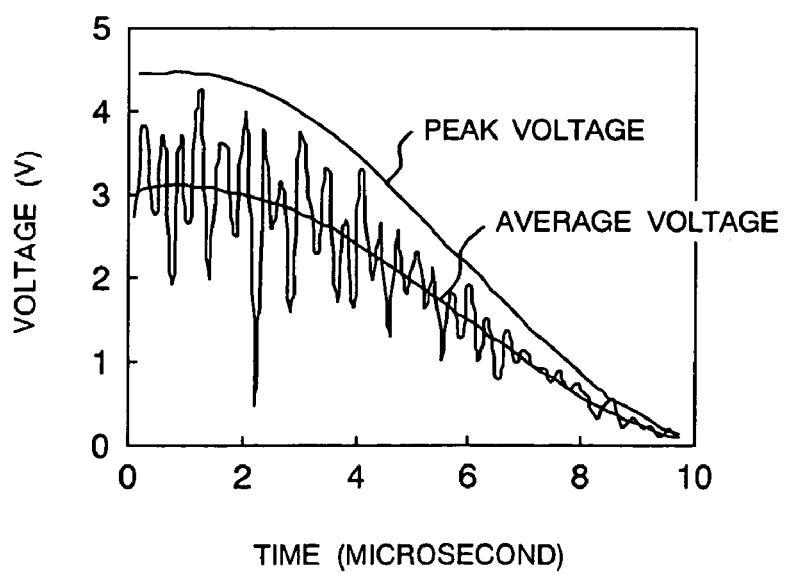
FIG. 2 illustrates the average voltage and the peak voltage of a W-CDMA envelope signal.

In FIG. 2, in addition to the envelope signal voltage, its average and peak voltages are shown at the same time. The peak factor given by (the peak of the envelope signal voltage)/(the average of the envelope signal voltage) is a constant unique to each wireless communication system, and remains unchanged even if the average voltage of the envelope signal varies. Similarly, the bottom voltage of the envelope signal is proportional to the average voltage of the envelope signal, and in the case of a W-CDMA signal in particular, the factor of proportionality is 0. FIG. 2 shows a case of such a W-CDMA signal.

The power supply voltage of the class B amplifier being represented by Vbp, its average output voltage by Vba, the maximum output voltage of the envelope amplifier by Vop, its average output voltage by Voa, and its minimum output voltage by Vom, the condition under which the class B amplifier does not generate clipping distortion is:

$$Vbp-Vba \geq Vop-Voa, \quad Vba \geq Voa-Vom \quad (1)$$

By using the peak factor FP=Vop/Voa, Fm=Vom/Voa, Formula (1) can be converted into:

$$Vbp-Vba \geq (Fp-1)Voa, \quad Vba \geq (1-Fm)Voa \quad (2)$$

According to the invention, the power supply voltage Vbp of the class B amplifier and the average output voltage Vba of the class B amplifier are so controlled as to be proportional to the average output voltage Voa of the envelope amplifier. Therefore, with the control factors being represented by Kbp=Vbp/Voa, Kba=Vba/Voa, $$Kbp-Kba \geq Fp-1, \quad Kba \geq 1-Fm \quad (3)$$

These are the basic formulas of the invention. Especially where the control factors being represented by Kba=1 or KbP=1, $$Kba=1, Kbp \geq Fp, Fm \geq 0 \quad (4)$$

$$KbP=1, 2-FP \geq Kba \geq 1-Fm, 1 \geq FP-Fm \quad (5)$$

These cases, in which control is simplified, are especially useful for practical application.

However, though the third of Formula (4) always holds, that of Formula (5) does not always hold, and accordingly the applicable range of Formula (5) is limited. If Formula (3) or Formulas (4) and (5) hold, clipping distortion can be suppressed. The greater the difference between the two sides of each inequality, the greater the margin against distortion, but the lower the efficiency. The smaller the difference between the two sides of each inequality, the smaller the margin against distortion, but the higher the efficiency.

This embodiment of the invention is supposed to be used as a W-CDMA terminal. In this case, since FP−Fm>1 from the foregoing explanation, Formula (5) cannot be applied. Accordingly, the control factors Kbp=FP, Kba=1 are set to satisfy Formula (4). Thus, (a) the power supply voltage Vbp of the class B amplifier is so controlled as to be the peak factor multiple of the average output voltage Voa of the envelope amplifier; and (b) the average output voltage Vba of the class B amplifier is so controlled as to be equal to the average output voltage Voa of the envelope amplifier.

In this embodiment, the condition of (a) above has been successfully met by detecting the low frequency components of the input signal with the low pass filter 1, controlling the DC—DC converter 2 with these low frequency components, generating two outputs proportional to the low frequency components of the input signal and differing in their factor of proportionality by the peak factor multiple, supplying the output terminal 6 with the low voltage output whose factor of proportionality is smaller, and supplying the class B amplifier 3 with a high voltage output whose factor of proportionality is greater. Furthermore, since the voltage gain of the low voltage output of the DC—DC converter 2 and the voltage gain of the class B amplifier 3 are made equal to each other in this embodiment, the condition of (b) has been readily met by directly giving the input signal as it is to the class B amplifier.

This embodiment has been described with reference to a case in which the control factor Kbp is equalized to the peak factor Fp. In an actual design, however, Kbp is not always equal to Fp. A system more permissive to distortion can be designed for an even higher efficiency by intentionally setting Kbp smaller than Fp. Or a system less permissive to distortion can be deliberately designed to have a greater Kbp than Fp, with the manufacturing margin and other factors taken into consideration. These designs are also made possible by utilizing the operating principle of the present invention, and accordingly are included within the scope of the invention.

Figure 3:
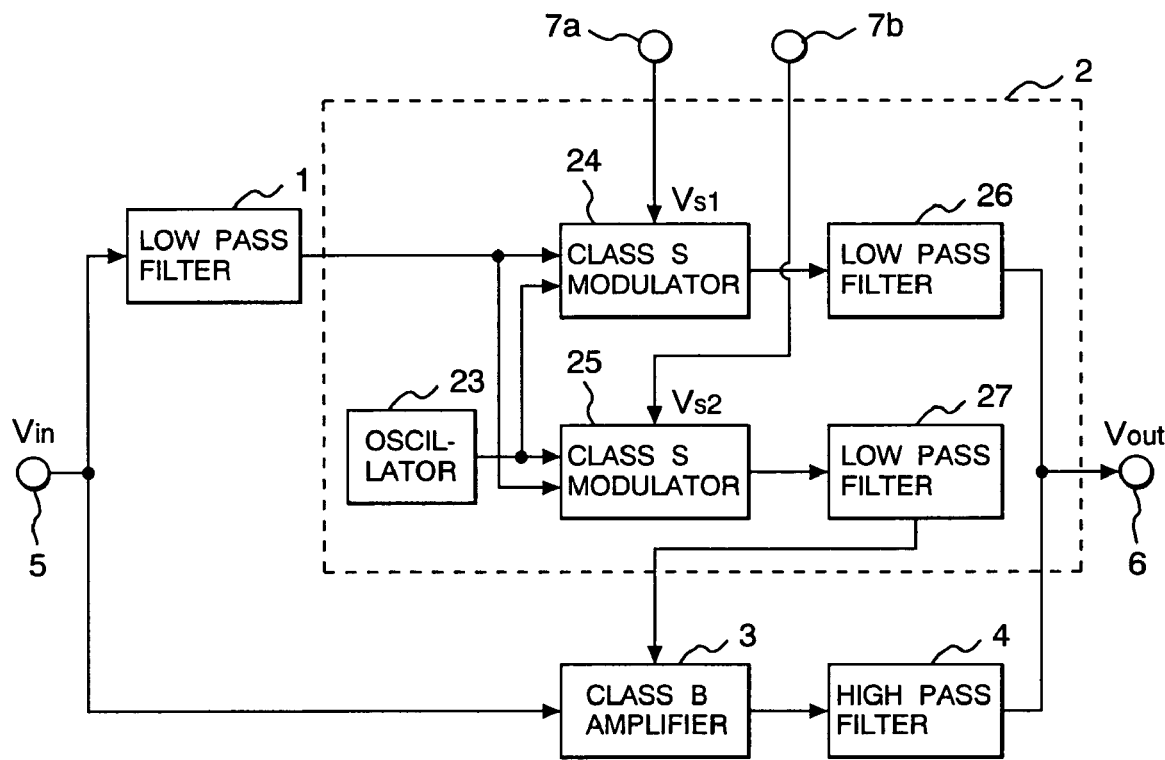
FIG. 3 is a configurational diagram illustrating details of the configuration of an envelope amplifier in FIG. 1.

More details of the configuration of the amplifier embodying the invention in this mode are show in FIG. 3. The envelope amplifier is configured of the low pass filter 1, an oscillator 23, a first class S modulator 24, a second class S modulator 25, a first low pass filter 26, a second the low pass filter 27, the class B amplifier 3, the high pass filter 4, the input terminal 5, the output terminal 6, a first power supply terminal 7a, and a second power supply terminal 7b. The oscillator 23, the first class S modulator 24, the second class S modulator 25, the first low pass filter 26 and the second low pass filter 27 constitute the DC—DC converter 2 of FIG. 1.

The low frequency components extracted from the input signal by the low pass filter 1 are inputted into the first class S modulator 24 and the second class S modulator 25. Further, a saw-tooth signal from the oscillator 23 is inputted into the first class S modulator 24 and the second class S modulator 25. Receiving the supply of a power supply voltage Vs1 from the first power supply terminal 7a, the first class S modulator 24 generates a rectangular wave of Vs1 in amplitude, pulse width-modulated with the low frequency components and the saw-tooth signal. This rectangular wave is smoothed by the first low pass filter 26, and supplied to the output terminal 6.

Receiving the supply of a power supply voltage Vs2 from the second power supply terminal 7b, the second class S modulator 25 generates a rectangular wave of Vs2 in amplitude, pulse width-modulated with the low frequency components and the saw-tooth signal. This rectangular wave is smoothed by the second low pass filter 27, and supplied to the power supply terminal of the class B amplifier 3. Further, the input signal is amplified by the class B amplifier 3, cleared of the low frequency components by the high pass filter 4, and supplied to the output terminal 6.

In order to realize operation of the envelope amplifier with low distortion and at high efficiency, the power supply voltages Vs1 and Vs2 are appropriately set. Since the first class S modulator 24 and the second class S modulator 25 receive a common input signal, the two output rectangular waves differ only in amplitude, and therefore the two output voltages obtained by smoothing by the first low pass filter 26 and the second low pass filter 27 always have a certain voltage ratio. This voltage ratio is determined by the amplitude ratio of the original rectangular waves, namely the power supply voltage ratio between the class S modulators 24 and 25.

Therefore, by setting the power supply voltage ratio Vs2/Vs1 between the first class S modulator 24 and the second class S modulator 25 to the peak factor of the modulating signals to be amplified, the power supply voltage fed to the class B amplifier 3 can be so controlled as to be always the peak factor multiple of the low frequency component output. Further, in order to align the rate of voltage amplification by the first class S modulator 24 and the first low pass filter 26 with that of the class B amplifier 3, Vs1 can be adjusted while keeping the Vs2/Vs1 ratio unchanged. In the manner described above, the envelope amplifier can achieve operation with low distortion and high efficiency according to the invention.

Due to the operating principle of the present invention, it is desirable for the characteristics of the two class S modulators 24 and 25 to be matched. However, as it is sufficient to match the output voltage waveforms, there is no need to configure the two class S modulators 24 and 25 of components of the same size, and scaling is possible while keeping the relationship between the constituent elements as it is. It is necessary also to scale the two low pass filters 26 and 27 at the same time, though. By utilizing the possibility of scaling, where the two class S modulators 24 and 25 differ in average output amperage, what has the smaller average output amperage can be smaller in size.

As this embodiment uses the two class S modulators 24 and 25 matched in operating conditions, the power supply voltage of the class B amplifier 3 can be controlled to the optimal state with such simple means as the voltage ratio between the two power supply terminals 7a and 7b. Since the operating state of the class B amplifier 3 is kept optimal against variations in environmental conditions including the temperature as long as the characteristics of the two class S modulators 24 and 25 vary in the same direction, the envelope amplifier stably operates with a wide margin of operation.

Thus this embodiment of the invention can enhance the efficiency of the class B amplifier 3 without allowing clipping distortion to occur, and accordingly an envelope amplifier, i.e. an amplifier of a wide band, high efficiency, and low distortion has been successfully realized. The envelope amplifier in this mode of embodying the invention has achieved a frequency range of 10 MHz and an efficiency of 85%, yet allowing no clipping distortion to occur even when amplifying a W-CDMA envelope signal.

Figure 4:
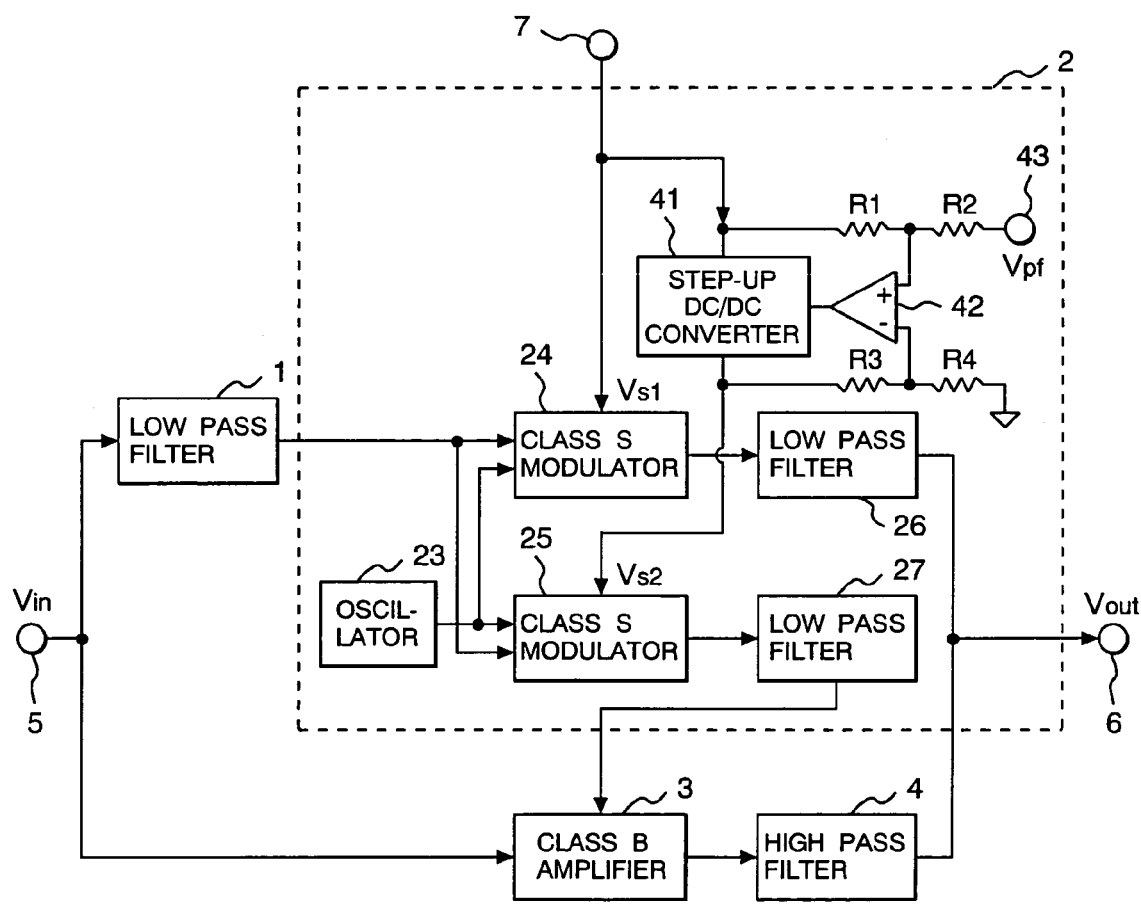
FIG. 4 is a configurational diagram illustrating a second preferred embodiment of the invention.

An amplifier, which is a second preferred embodiment of the invention, is shown in FIG. 4. This embodiment differs from the configuration shown in FIG. 3 in that the second power supply terminal 7b is excluded and a Vs2 regulating circuit including a step-up DC—DC converter 41, an operational amplifier 42, resistance elements R1, R2, R3 and R4, and a peak factor setting element 43 is added between the first power supply terminal 7a (hereinafter to be referred to as the power supply terminal 7) and the second class S modulator 25.

The power supply terminal of the step-up DC—DC converter 41 is connected to the power supply terminal 7 of the envelope amplifier, and its output terminal, to the power supply terminal of the second class S modulator 25. The non-inversion input terminal of the operational amplifier 42 is connected to the power supply terminal 7 of the envelope amplifier via the resistance R1 and to the peak factor setting element 43 via the resistance R2.

An inversion input terminal is connected to the output terminal of the step-up DC—DC converter 41 via the resistance R3 and grounded via the resistance R4. The output terminal of the operational amplifier 42 is connected to the control terminal of the step-up DC—DC converter 41.

By setting the resistances R1, R2, R3 and R4 all equal, an adder circuit is configured, and the voltage Vs1 of the power supply terminal 7 of the envelope amplifier, the voltage Vpf of the peak factor setting element 43 and the output voltage Vs2 of the step-up DC—DC converter 41 have a relationship of Vs2=Vs1+Vpf. Therefore, by applying the difference between Vs2 and Vs1 to the peak factor setting element 43, Vs2 can be controlled to any desired level.

By the use of the step-up DC—DC converter 41 in this embodiment, the power supply voltage required by the envelope amplifier is Vs1 alone, and there is an advantage over the embodiment shown in FIG. 3 which receives two kinds of power supply including Vs1 and Vs2 that the external circuitry can be simplified when the envelope amplifier is used. A conceivable alternative to this embodiment is to receive from outside the power supply of Vs2 and cause a step-down DC—DC converter to generate Vs1.

However, in an application such as a mobile device whose requirement for a lower voltage is keen, it is more advantageous to use this embodiment which receives the power supply of a lower voltage Vs1. Furthermore in this embodiment, there is provided the peak factor setting element 43 which permits external control of the output voltage of the step-up DC—DC converter 41. Since the level of the peak factor varies with the system to which the amplifier is applied, the presence of the setting element 43 allows the same type to be applied to a plurality of systems, and thereby contributes to the versatility of the radio frequency power amplifier.

Figure 5:
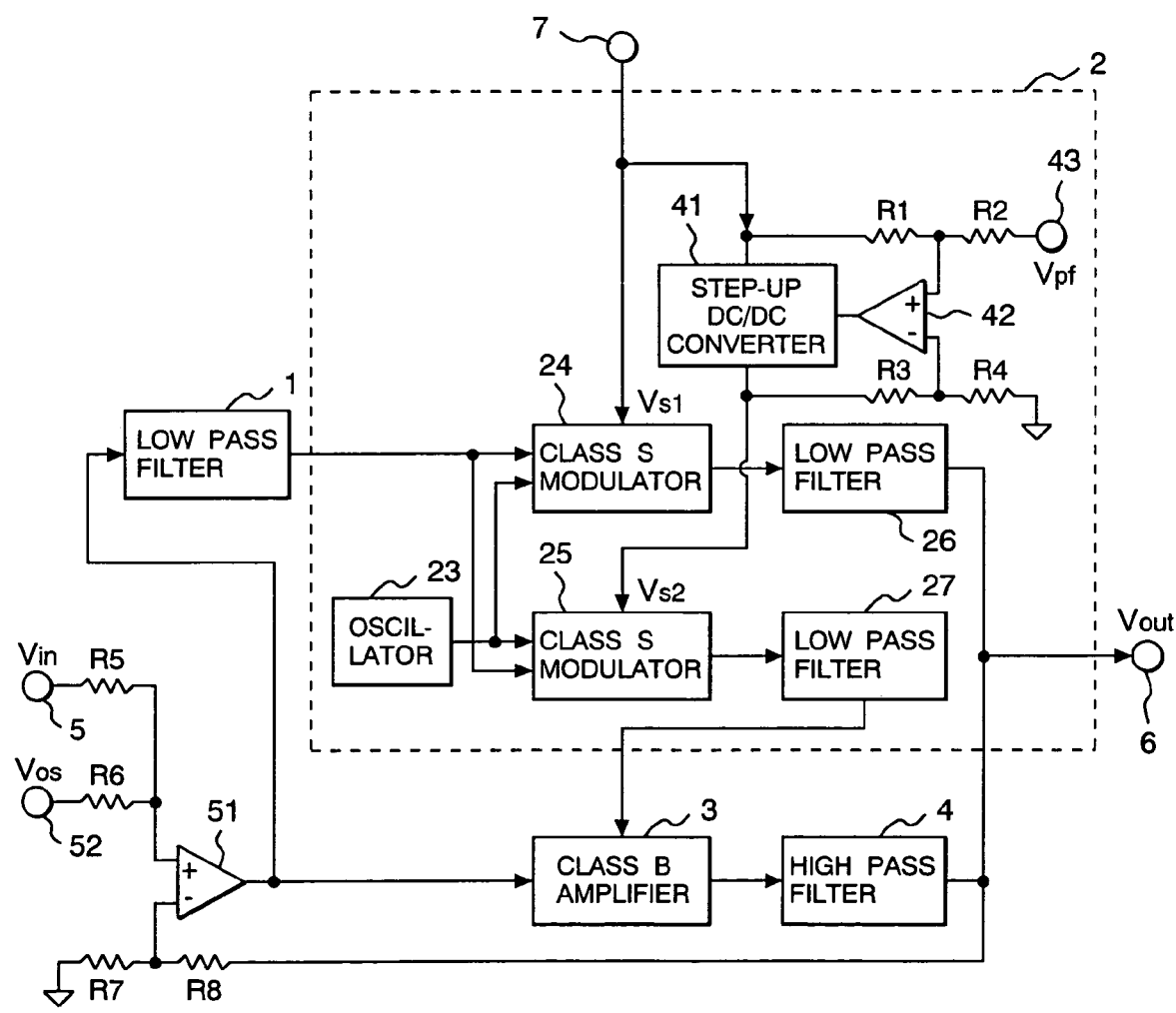
FIG. 5 is a configurational diagram illustrating a third preferred embodiment of the invention.

Another amplifier, which is a third preferred embodiment of the invention, is shown in FIG. 5. This embodiment is composed by adding a negative feedback circuit using an operational amplifier 51 and resistance elements R5, R6, R7, and R8, and an offset regulating terminal 52 to the configuration of FIG. 4. This negative feedback circuit constitutes a negative feedback loop for feeding back the output signal at the output terminal 6 to the input signal side.

The non-inversion input terminal of the operational amplifier 51 is connected to the input terminal 5 of the envelope amplifier via the resistance R5 and to the offset regulating terminal 52 via the resistance R6. It is further grounded via the resistance R7 and connected to the output terminal 6 of the envelope amplifier via the resistance R8. The relationships in terms of resistance level are R5=R7, R6=R8, R6/R5=K.

This is a weighted adder circuit, and the relationship of the voltage Vout of the output terminal 6 of the envelope amplifier to the voltage Vin of the input terminal 5 of the envelope amplifier and to the voltage Vos of the offset setting terminal 52 is Vout=K×Vin+Vos. The use of the weighted adder circuit here is intended for the correction to be described below.

Figure 6:
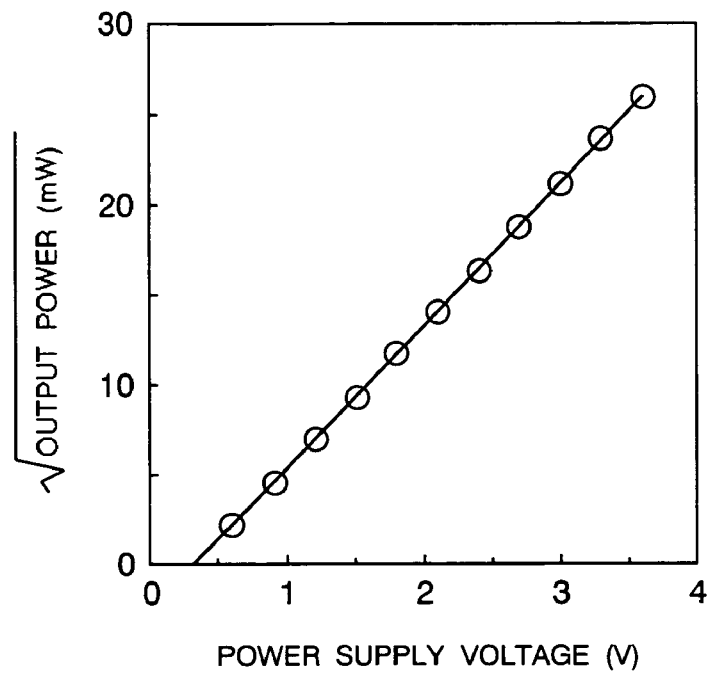
FIG. 6 illustrates the relationship between the power supply voltage and the output power of the carrier amplifier.

When an EER type amplifier is to be configured by combining an envelope amplifier with a carrier amplifier, the control characteristics of the carrier amplifier have to be taken into consideration. The relationship of the power supply voltage Vsup and the output power Pout of a carrier amplifier operating near or in saturation is illustrated in FIG. 6. This example is a carrier amplifier using a heterojunction bipolar transistor (HBT). Since Pout is substantially proportional to the square of Vsup, a linear relationship is obtained by using a square root of Pout on the vertical axis. However, Vsup of the point resulting from extrapolation of this linear relationship to Pout=0 is not 0, but a certain positive voltage (offset voltage).

For highly linear power supply modulation of the carrier amplifier, this offset voltage has to be corrected. By adding in advance an offset voltage equivalent to the envelope signal and then applying that augmented signal to the power supply terminal of the carrier amplifier, the offset voltage of the carrier amplifier will be canceled to make possible highly linear power supply modulation. The envelope amplifier of this embodiment realizes this correction of the offset voltage by using the weighted adder circuit, and the correction voltage can be set as desired from outside.

In the amplifier embodying the invention in this mode, namely the envelope amplifier, the frequency-dependence of gains is improved by the effect of the negative feedback circuit. Since the envelope amplifier of this embodiment amplifies the low frequency components and the high frequency components by separate routes, in view of possible manufacturing fluctuations of components, it may be sometimes difficult to accurately match the gains of the different routes. In this embodiment, this problem is solved by the use of the negative feedback circuit. As the operational amplifier 51 has a sufficient gain, the gain of the feedback circuit is in effect determined by a resistance connected to the operational amplifier 51, and is substantially constant irrespective of the routing of amplification.

Figure 15:
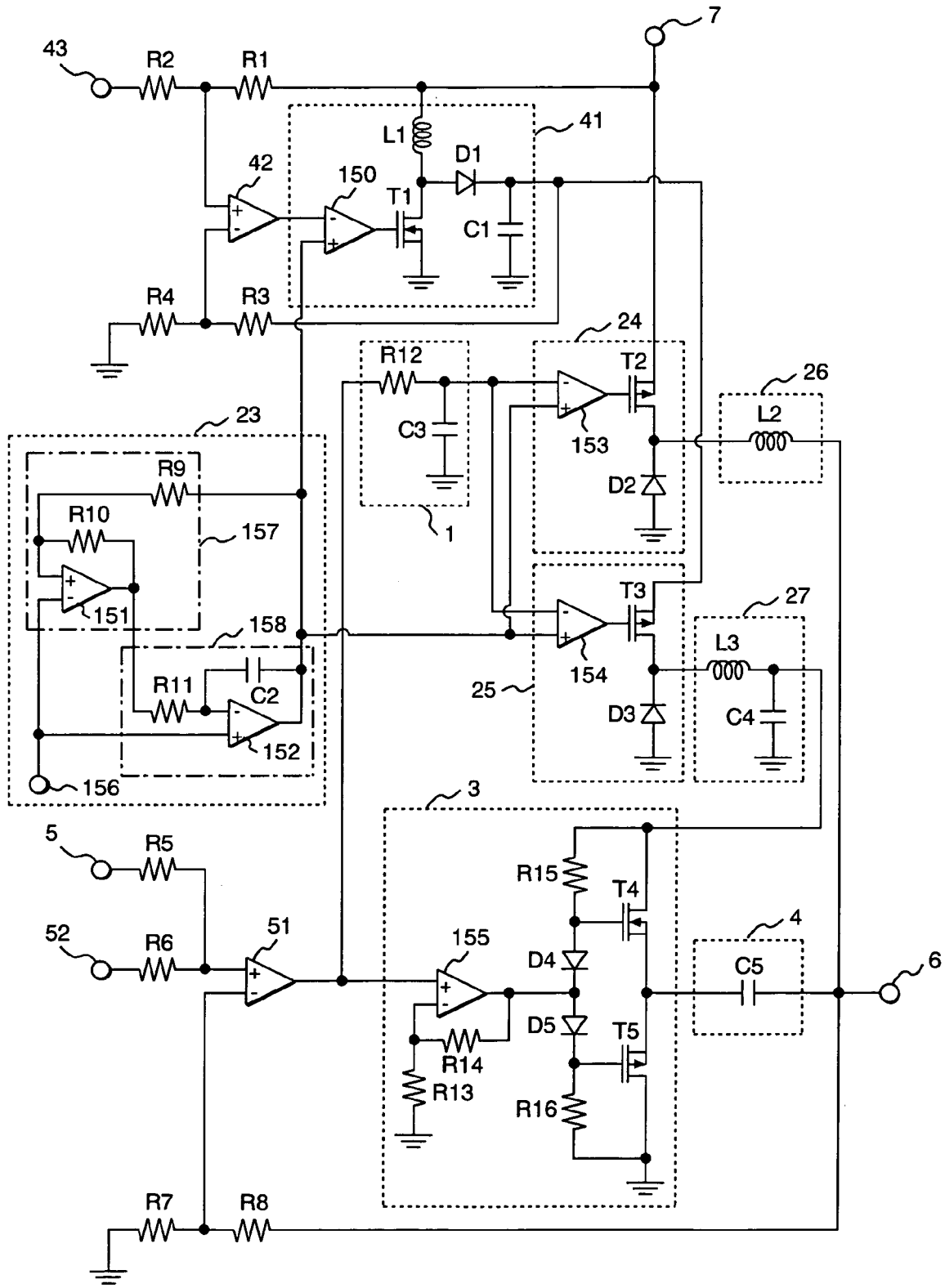
FIG. 15 is a circuit diagram showing details of a typical example of circuitry for the third preferred embodiment of the invention.

An example of detailed circuitry of the amplifier embodying the invention in this mode is shown in FIG. 15. As the oscillator 23 is used a well-known triangular wave oscillator consisting of a Schmidt circuit 157 and an integrating circuit 158. An operational amplifier 151 and resistance elements R9 and R10 constitute a Schmidt circuit, and an operational amplifier 152, a resistance element R1 and a capacitance element C2 constitute the integrating circuit. The output of the Schmidt circuit 157 is connected to the integrating circuit 158, and that of the integrating circuit 158 is fed back to the Schmidt circuit 157 via the resistance element R9. A bias voltage, about ½ of the power supply voltage, is applied to a bias terminal 156 for supplying bias voltages to the operational amplifiers 151 and 152.

The output voltage of the Schmidt circuit 157 is either positive (the power supply voltage) or 0 (grounding voltage). When the output voltage of the Schmidt circuit 157 is positive, the output voltage of the integrating circuit 158 decreases in a constant slope. When the output voltage of the integrating circuit 158 becomes lower than the threshold voltage of the Schmidt circuit 157, the output voltage of the Schmidt circuit 157 changes to 0, and the output voltage of the integrating circuit 158 increases in a constant slope. When the output voltage of the integrating circuit 158 rises beyond the threshold voltage of the Schmidt circuit 157, the output voltage of the Schmidt circuit 157 returns to a positive level, and the output voltage of the integrating circuit 158 again decreases in a constant slope. The repetition of this operation gives a triangular wave as the output of the integrating circuit 158. The oscillation frequency of this triangular wave oscillator is fo=(R10/R9)/(4×C2×R11). In this embodiment, R9=8.2 kΩ, R10=10 kΩ, R11=300Ω and C2=1000 pF, and the oscillation frequency fo is about 1 MHz.

The low pass filter 1 used here is an RC filter consisting of a resistance element R12 and a capacitance element C3. If the output voltage of the low pass filter 1 has a frequency component higher than the oscillation frequency fo of the oscillator 23, chattering will occur when the output levels of the class S modulators 24 and 25 are changed. To avoid it, the cut-off frequency fc of the low pass filter 1 is set lower than the oscillation frequency fo of the oscillator 23. In this embodiment, R12=1.5 kΩ, C3=1 nF, and the cut-off frequency fc is about 100 kHz.

The class S modulator 24 is configured of an operational amplifier 153, a transistor T2 and a diode D2. The transistor T2 is a p-MOSFET. An inductor L2 corresponds to the low pass filter 26. In this embodiment, L2=7.5 µH.

The operational amplifier 153 is a comparator, which compares an input voltage from the oscillator 23 and an input voltage from the low pass filter 1, and turns on or off the transistor T2. Since the input voltage from the oscillator 23 is a triangular wave, the transistor T2 is turned on and off in its cycle. The lower the input voltage from the low pass filter 1, the longer the period of a higher input voltage from the oscillator 23 in one cycle, and the longer the period in which the transistor T2 is off. Conversely, the higher the input voltage from the low pass filter 1, the longer the period in which the transistor T2 is on. In this way, according to the input voltage from the low pass filter 1, the period in which the transistor T2 is on is modulated. As the source electrode of the transistor T2 is connected to the power supply terminal 7, the output of the class S modulator 24 rises to the power supply voltage when the transistor T2 is on. When the transistor T2 is off, the output of the class S modulator 24 falls until it is clipped by the diode D2. The output of the class S modulator 24 is smoothed by the low pass filter 26 and becomes a signal proportional to the input voltage from the low pass filter 1. Thus the output of the class B amplifier 3 is cleared of its high frequency components by the low pass filters 1 and 26, and its low frequency components are supplied to the output terminal 6.

The class S modulator 25 is configured of an operational amplifier 154, a transistor T3 and a diode D3. The transistor T3 is a p-MOSFET. The low pass filter 27 is configured of an inductor L3 and a capacitance element C4. In this embodiment, L3=7.5 µH, C4=300 nF.

The class S modulator 25 operates similarly to the class S modulator 24, but differs in output voltage. As the source electrode of the transistor T3 is connected to the output of the step-up DC—DC converter 41, the output of the class S modulator 25 rises to the output voltage of the step-up DC—DC converter 41 when the transistor T3 is on. The output of the class S modulator 25 is smoothed by the low pass filter 27, and becomes a signal proportional to the input voltage from the low pass filter 1. The signal resulting from the smoothing of the output of the class S modulator 25 is j times the signal resulting from the smoothing of the output of the class S modulator 24, where j is the step-up ratio of the DC—DC converter 41.

The class B amplifier 3 is configured of two stages: a pre-amplifier consisting of an operational amplifier 155 and resistance elements R13 and R14, and a post-amplifier consisting of transistors T4 and T5, diodes D4 and D5, and resistance elements R15 and R16. The post-amplifier is a push-pull circuit, the transistor T4 is an n-MOSFET, and the transistor T5 is a p-MOSFET. A capacitance element C5 corresponds to the high pass filter 4. In this embodiment, C5=3 nF.

An input signal from the operational amplifier 51 is subjected to non-inversion amplification by the pre-amplifier and to current amplification by the post-amplifier. The diodes D4 and D5 are level shift diodes, which shift the signal voltage by equivalents of the threshold voltages of the transistors T4 and T5 to prevent crossover distortion of the transistors T4 and T5. The bias currents of the diodes D4 and D5 are supplied from the resistance elements R15 and R16. The output of the class B amplifier 3 are cleared of its D.C. components and low frequency components by the high pass filter 4, and its high frequency components are supplied to the output terminal 6.

The step-up DC—DC converter 41 is configured of an operational amplifier 150, a transistor T1, a diode D1, an inductor L1 and a capacitance element C1. The transistor T1 is an n-MOSFET.

The operational amplifier 150 is a comparator, which compares the input voltage from the oscillator 23 and the input voltage from the operational amplifier 42, and turns on or off the transistor T1. Since the input voltage from the oscillator 23 is a triangular wave, the transistor T1 is turned on and off in its cycle. The higher the input voltage from the operational amplifier 42, the longer the duration in which the input voltage from the oscillator 23 is lower in one cycle, and the longer the period in which the transistor T1 is off. When the transistor T1 is off, the drain voltage rises, and the diode D1 is placed in a state of conduction. When the transistor T1 is on, the drain voltage falls, and the diode D1 goes out of the state of conduction. The current flowing to the diode D1 when it is in the state of conduction charges the capacitance element C1. The longer the period in which the transistor T1 is off, the longer the period in which the capacitance element C1 is charged, and the higher the output voltage of the DC—DC converter 41 rises. Therefore, the higher the input voltage level of the operational amplifier 42, the higher the output voltage of the DC—DC converter 41 rises. The output of the DC—DC converter 41 is supplied to the class S modulator 25.

Figure 7:
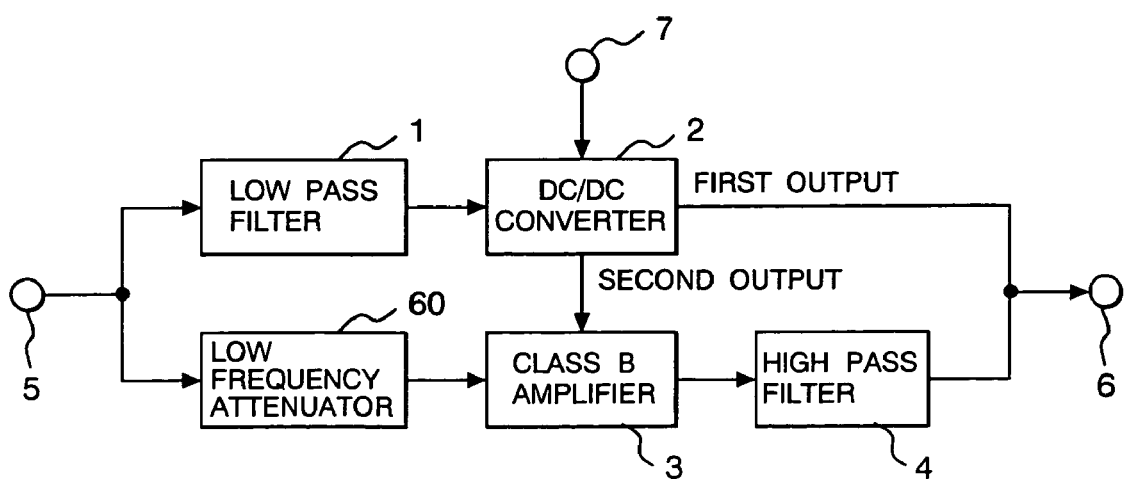
FIG. 7 is a configurational diagram illustrating a fourth preferred embodiment of the invention.

Another amplifier, which is a fourth preferred embodiment of the invention, is shown in FIG. 7. This embodiment is configured by adding a low frequency attenuator 60 between the input terminal 5 of the envelope amplifier and the class B amplifier 3 shown in FIG. 1. The low frequency attenuator 60 in this embodiment has a certain ratio of attenuation for the low frequency components of the envelope signal but scarcely attenuates the high frequency components.

The amplifier embodying the invention in this mode, namely the envelope amplifier, is enabled by the addition of the low frequency attenuator 60 to set the operating state of the class B amplifier 3 more flexibly. The voltage gain of the first output of the DC—DC converter 2 being represented by G1, the voltage gain of its second output by G2, the gain of the class B amplifier 3 by GB, and the attenuation ratio of the low frequency attenuator 60 by LA and GB being equal to G1, control factors Kbp and Kba are equal to G2/G1 and LA, respectively. In this way, the use of the low frequency attenuator 60 enables the control factors Kbp and Kba to be separately set.

In this embodiment, to satisfy Formula (3), the control factors are set to be Kbp−Kba=Fp−1 and Kba=1−Fm. This corresponds to G2/G1=Fp−Fm, LA=1−Fm, and control is enabled to optimize the peak factors Fp and Fm of the system by (a) setting the output voltage ratio of the DC—DC converter 2 to Fp−Fm and (b) setting the attenuation ratio of the low frequency attenuator 60 to 1−Fm.

This embodiment has been described with reference to a case in which two sides in Formula (3) are equal. In an actual design, however, they are not always equal as in the case already described with reference to FIG. 1.

The envelope amplifier embodying the invention in this mode is particularly suitable for Personal Digital Cellular (PDC) and other systems in which Fm is greater than 0. If applied to the PDC system or the like, this embodiment can make Vbp−(Fp−Fm)×Voa hold, not Vbp=Fp×Voa as in the embodiment of FIG. 1, and this means that even higher efficiency can be achieved by reducing the power supply voltage of the class B amplifier 3.

Figure 8:
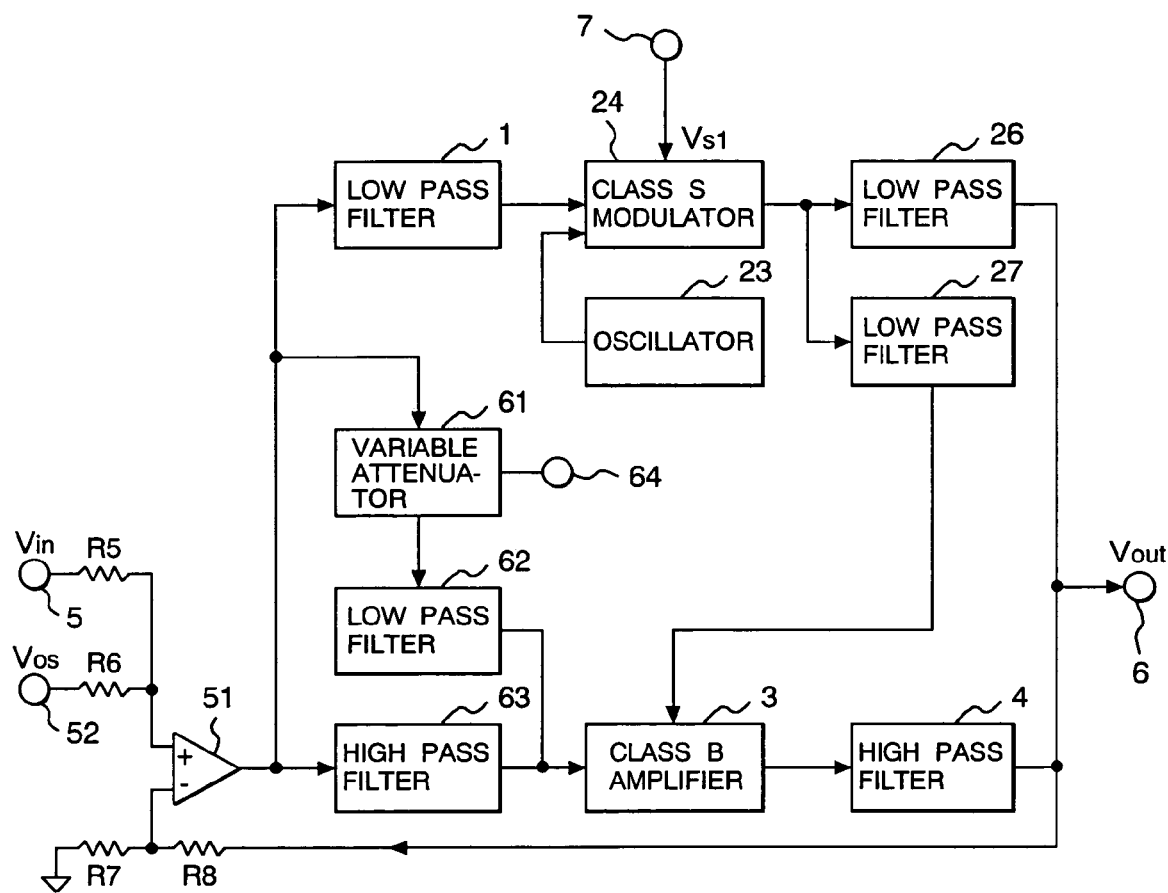
FIG. 8 is a configurational diagram illustrating a fifth preferred embodiment of the invention.

Another amplifier, which is a fifth preferred embodiment of the invention, is shown in FIG. 8. This embodiment differs from the configuration shown in FIG. 3 in that the second class S modulator 25 and the second power supply terminal 7b are added and a variable attenuator 61, a low pass filter 62, a high pass filter 63, a peak factor setting terminal 64, the operational amplifier 51, the offset setting terminal 52, the resistances R5, R6, R7 and R8 are added.

The oscillator 23, the class S modulator 24, the first low pass filter 26 and the second low pass filter 27 constitute the DC—DC converter 2 of FIG. 7. The variable attenuator 61, the low pass filter 62, the high pass filter 63 and the peak factor setting terminal 64 constitute the low frequency attenuator 60 of FIG. 7.

Low frequency components extracted from the input signal by the low pass filter 1 and a saw-tooth signal from the oscillator 23 are inputted into the class S modulator 24. The class S modulator 24 is supplied with the power supply voltage Vs1 from the power supply terminal 7, and generates a pulse width-modulated rectangular wave of Vs1 in amplitude.

This rectangular wave is smoothed by the first low pass filter 26 and supplied to the output terminal 6 or smoothed by the second low pass filter 27 and supplied to the power supply terminal of the class B amplifier 3. The high frequency components of the input signal are inputted into the class B amplifier 3 via the high pass filter 63. The low frequency components, after being attenuated by the variable attenuator 61 under the control of the peak factor setting terminal 64, are inputted into the class B amplifier 3 via the low pass filter 62.

These components, after being amplified by the class B amplifier 3, are cleared of low frequency components by the high pass filter 4, and supplied to the output terminal 6. The operational amplifier 51, the offset setting terminal 52, and the resistances R5, R6, R7, and R8 constitute a negative feedback circuit similar to its counterpart in the embodiment of FIG. 5, and its effect is also similar to that of the embodiment of FIG. 5.

This embodiment has an envelope amplifier particularly suitable for systems having a peak factor of Fp−Fm≦1. In this case, Formula (5) can be used, where Kbp=1, 2−Fp≧Kba≧1−Fm apply. Thus, (a) the power supply voltage Vbp of the class B amplifier 3 is so controlled as to be equal to the average output voltage Voa of the envelope amplifier, and (b) the attenuation ratio Lv of the variable attenuator 61 can be controlled within the range of 2−Fp≧Lv≧1−Fm.

In this embodiment, by supplying the low frequency output of the envelope amplifier and power supply to the class B amplifier 3 from the same class S modulator 24, the condition of (a) is readily satisfied. Further in this embodiment, the attenuation ratio Lv is set to 0.5. This enables envelope signals of a system having a peak factor of Fp≦1.5, Fm≧0.5 to be amplified without allowing any clipping distortion to occur.

In this embodiment, the configuration of the DC—DC converter 2 has been significantly simplified by using the conditions of Formula (5) according to the invention. Furthermore, the low frequency attenuator 60 of this embodiment can be set from outside with the peak factor setting terminal 64, which contributes to versatility of the envelope amplifier. The configuration of the low frequency attenuator 60 can be simplified where no external setting is needed, such as in the mass-production of a single model.

Figure 9:
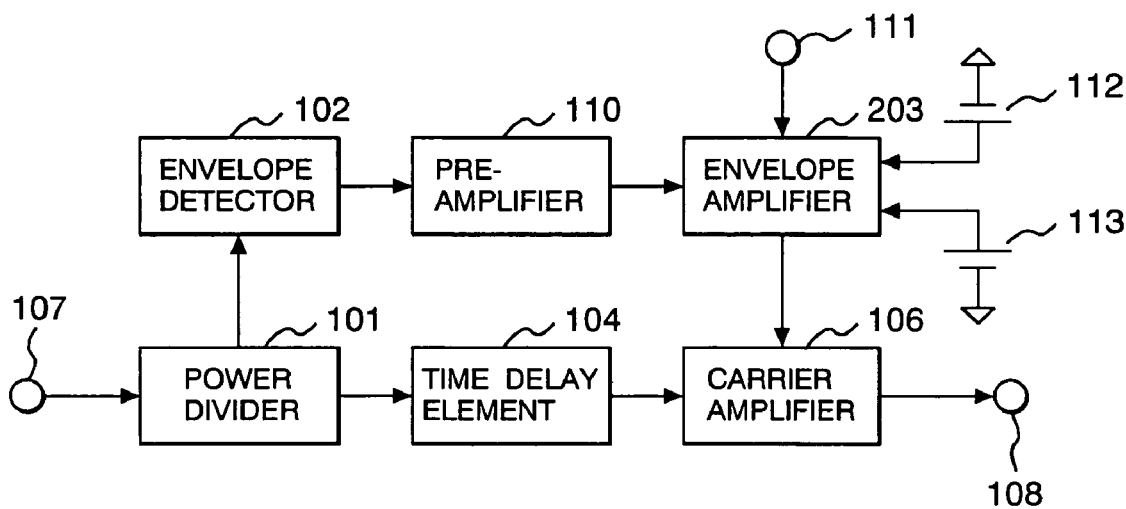
FIG. 9 is a configurational diagram illustrating a sixth preferred embodiment of the invention.

A radio frequency power amplifier, which is a sixth, preferred embodiment of the invention is illustrated in FIG. 9. This embodiment is an EER type amplifier particularly suitable for use in the transmitter unit of a W-CDMA terminal. The EER type amplifier embodying the invention in this mode is configured of the envelope detector 102, a pre-amplifier 110, the envelope amplifier 203, the power divider 101, the time delay element 104, the carrier amplifier 106, a radio frequency input terminal 107, a radio frequency output terminal 108, and a power supply terminal 111. The envelope amplifier 203 used here is what is shown in FIG. 5. The carrier amplifier 106 is an amplifier which operates near or in saturation.

A radio frequency input signal from the radio frequency input terminal 107 is divided by the power divider 101, and one of the divided signals is inputted into the envelope detector 102. An envelope signal detected by the envelope detector 102, after being amplified by the pre-amplifier 110, is inputted into the envelope amplifier 203. The power supply voltage of the envelope amplifier 203 is 3.5 V. As the offset voltage 113 of the envelope amplifier 203, 0.3 V is applied to match the power supply voltage-output power characteristic of the carrier amplifier 106.

Also, the peak factor setting voltage 112 of the envelope amplifier 203, 1.3 V is applied to match the signal waveform of W-CDMA. The output of the envelope amplifier 203 is supplied to the power supply terminal of the carrier amplifier 106.

The other signal resulting from division by the power divider 101 is inputted into the time delay element 104. This time delay element 104 compensates for any delay on the envelope signal route. The output of the time delay element 104 is amplified by the carrier amplifier 106. The carrier amplifier 106 operates near or in saturation, and its power-added efficiency at 27 dBm output is 70%. The output power of the carrier amplifier 106 undergoes power supply modulation with the output of the envelope amplifier 203, and a radio wave output signal whose envelope components have been recovered is obtained at the output terminal 108.

The EER type amplifier embodying the invention in this mode can amplify W-CDMA signals at high efficiency and with low distortion by virtue of the use of the envelope amplifier 203 according to the invention, resulting in the achievement of such excellent performance characteristics as a power-added efficiency of 60% and adjacent-channel power leak of −42 dBc.

Figure 10:
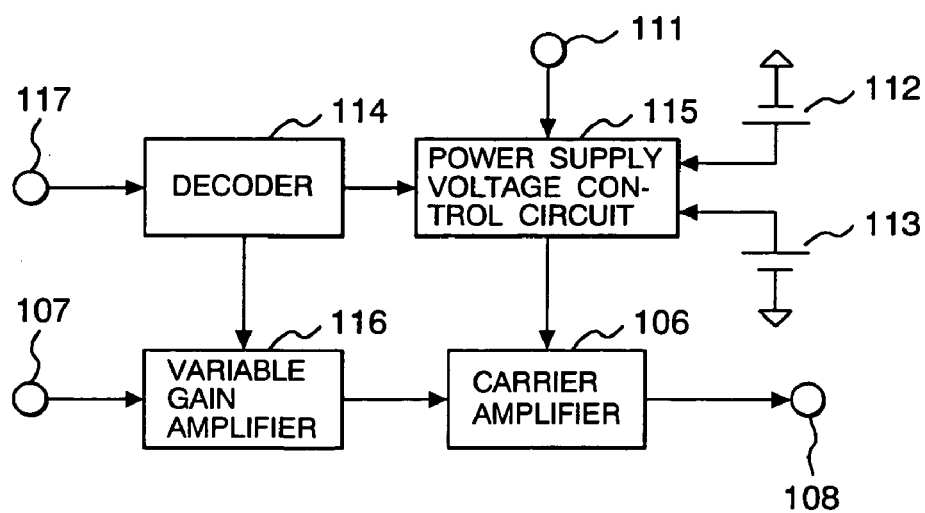
FIG. 10 is a configurational diagram illustrating a seventh preferred embodiment of the invention.
Figure 11:
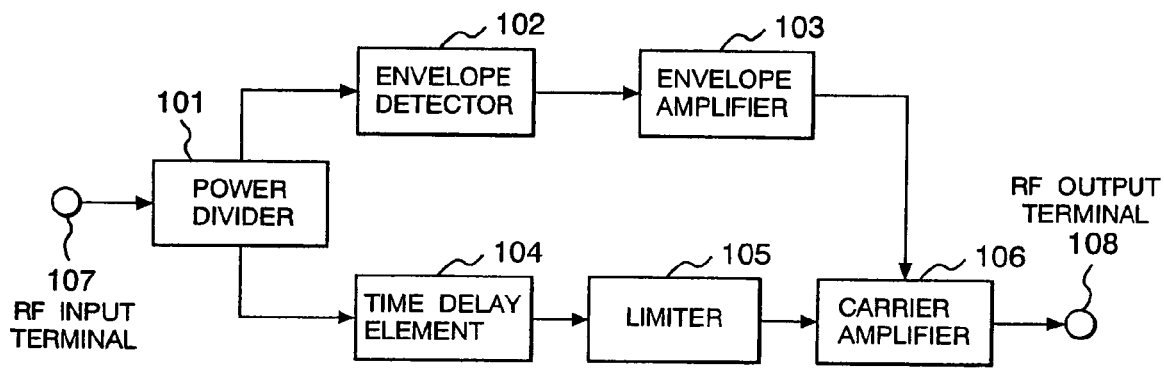
FIG. 11 is a configurational diagram illustrating a radio frequency power amplifier according to the prior art.

Another radio frequency power amplifier, which is a seventh embodiment, using the amplifier according to the invention as its power supply voltage control circuit is shown in FIG. 10. This embodiment is a radio frequency power amplifier intended for use in the terminal transmitter unit of a Global System for Mobile Communication (GSM). The radio frequency power amplifier is configured of a decoder 114, a power supply voltage control circuit 115, a variable gain amplifier 116, the carrier amplifier 106, the radio frequency input terminal 107, the radio frequency output terminal 108, the power supply terminal 111, and an output power control terminal 117. In this embodiment, the envelope amplifier of FIG. 5 is used as the power supply voltage control circuit 115.

A power control signal inputted from the output power control terminal 117 is converted by the decoder 114, and a gain control signal and a power supply voltage control signal are generated. The gain control signal is inputted into the control terminal of the variable gain amplifier 116. The power supply voltage control signal is inputted into the input terminal of the power supply voltage control circuit 115. The power supply voltage control circuit 115 receives power supply of 3.5 V. The offset setting voltage 113 of 0.3 V is applied to the power supply voltage control circuit 115 to match the power supply voltage-output power characteristic of the carrier amplifier 106.

As power control signals of the GSM system have no high speed modulation components unlike W-CDMA signals, their theoretical peak factor is 1, but a peak factor setting voltage 112 of 0.9 V is applied to allow a margin for the operation of the class B amplifier. The radio frequency signal power inputted from the radio frequency input terminal 107 is constant at −3 dBm, and amplified to the required power level by the variable gain amplifier 116 having received the gain control signal from the decoder 114.

The output of the variable gain amplifier 116 is inputted into the carrier amplifier 106. The carrier amplifier 106 operates near or in saturation, and its output power is controlled by the power supply voltage control circuit 115.

As long as the carrier amplifier 106 operates near or in saturation, its output power is not dependent on input power from the variable gain amplifier 116, and there is no need to strictly control the gain of the variable gain amplifier 116. Therefore, the gain of the variable gain amplifier 116, based on the assumption that the gain of the carrier amplifier 106 is constant at 24 dB, is controlled to a level calculated from the required output power.

This embodiment has been successfully realized as a power amplifier for GSM use with a power gain of 36 dB and a power-added efficiency of 60% at an operating frequency of 900 MHz and an output power of 33 dBm. The radio frequency output power can be controlled with a substantially accurate square characteristic by controlling the output power with the power supply voltage, resulting in improvement of the controllability of the output power over the conventional method of controlling the output power by using a bias voltage.

As GSM is a time division system, the power control signal takes on a stepwise waveform, and the step rise time is required to be within a few microseconds. Therefore, if a usual DC—DC converter is used for the power supply voltage control circuit 115, there will arise a problem in response speed. Further, if a series regulator is used for the power supply voltage control circuit 115, the efficiency will be reduced by a loss due to the voltage drop of the regulator.

This embodiment, as the envelope amplifier has attained the high speed as described above, a rise time of two microseconds or less has been achieved. Also, the radio frequency power amplifier embodying the invention in this mode has attained an efficiency of 60%, reflecting the high efficiency of the envelope amplifier according to the invention.

The present invention enables a class B amplifier to avoid occurrence of clipping distortion, thereby making it possible to realize a wide band, high efficiency and low distortion amplifier. By using this amplifier as the envelope amplifier for feeding a power supply voltage to the carrier amplifier, a high efficiency and low distortion radio frequency power amplifier that can be suitably applied to wide band wireless communication systems can be realized.

It is further understood by those skilled in the art that the foregoing description is a preferred embodiment of the disclosed device and that various changes and modifications may be made in the invention without departing from the spirit and scope thereof.

What is claimed is:

1. An amplifier, comprising:
   a DC—DC converter for amplifying a low frequency component of an input signal; and
   a class B amplifier for amplifying the input signal and outputting a high frequency components after amplification,
   wherein the DC—DC converter and the class B amplifier are connected in parallel, and a power supply voltage of the class B amplifier is controlled with the low frequency component.

2. The amplifier according to claim 1, wherein the low frequency component of the input signal of the amplifier and the power supply voltage of the class B amplifier are controlled so that the low frequency component and the power supply voltage have a constant ratio to each other.

3. The amplifier according to claim 2, wherein the constant ratio is substantially equal to a peak factor of a system using the amplifier.

4. The amplifier according to claim 2, wherein the low frequency component of the input signal to the class B amplifier is attenuated relative to the high frequency components of the input signal.

5. The amplifier according to claim 1, wherein the DC—DC converter outputs a first output signal and a second output signal differing from each other, the first output signal is supplied to a parallel-connected output terminal of the DC—DC converter and the class B amplifier, and the second output signal is supplied to the class B amplifier as the power supply voltage of the class B amplifier.

6. The amplifier according to claim 5, wherein the DC—DC converter comprises a first class S modulator for outputting the first output signal and a second class S modulator for outputting the second output signal.

7. The amplifier according to claim 1, wherein a negative feedback loop for feeding back an output signal of the amplifier to the input signal side is formed.

8. The amplifier according to claim 1, further comprising a circuit for correcting an offset voltage by adding an offset to an output signal of the amplifier.

9. The amplifier according to claim 6, further comprising a second DC—DC converter for supplying a higher power supply voltage than the power supply voltage of the first class S modulator to the second class S modulator.

10. The amplifier according to claim 6, wherein the input signal having passed a low pass filter is given to the first and second class S modulators, and cut-off frequency of the low pass filter is lower than frequency of a saw-tooth signal used for setting the voltages of the first and second output signals.

11. The amplifier according to claim 1, wherein the amplifier comprises:
   an oscillator including a Schmidt circuit including a first operational amplifier and a first and a second resistance element, an integrating circuit including a second operational amplifier, a third resistance element and a first capacitance element, a bias terminal for supplying a bias voltage to the first operational amplifier, and the second operational amplifier;
   a low pass filter including a fourth resistance element and a second capacitance element;
   a first class S modulator including a third operational amplifier, a first field effect transistor, and a first diode;
   a second class S modulator including a fourth operational amplifier, a second field effect transistor, and a second diode;
   the class B amplifier having a pre-amplifier including a fifth operational amplifier and a fourth and a fifth resistance element, and a post-amplifier including a third and a fourth field effect transistor, a third and a fourth diode, and a sixth and a seventh resistance element;
   a sixth operational amplifier connected to an input of the class B amplifier;
   a step-up DC—DC converter including a seventh operational amplifier, a fifth field effect transistor, a fifth diode, an inductor, and a third capacitance element; and
   an eighth operational amplifier connected to an input of the step-up DC—DC converter,
   wherein the output of the Schmidt circuit is connected to the integrating circuit, and an output of the integrating circuit is fed back to the Schmidt circuit,
   a bias voltage substantially equal to ½ of a power supply voltage is applied to the bias terminal,
   cut-off frequency of the low pass filter is lower than the oscillation frequency of the oscillator,
   the third operational amplifier is a comparator so constructed as to compare an input voltage from the oscillator and an input voltage from the low pass filter and to turn on or off the first field effect transistor accordingly,
   the fourth operational amplifier is a comparator so constructed as to compare an input voltage from the oscillator and an input voltage from the low pass filter and to turn on or off the second field effect transistor accordingly,
   the pre-amplifier subjects an input signal from the sixth operational amplifier to non-inversion amplification and the post-amplifier subjects the input signal having undergone the non-inversion amplification to current amplification,
   the bias currents of the third and fourth diodes are supplied from the sixth and seventh resistance elements, respectively,
   the seventh operational amplifier is a comparator so constructed as to compare an input voltage from the oscillator and an input voltage from the eighth operational amplifier and to turn on or off the fifth field effect transistor accordingly,
   an output signal of the sixth operational amplifier is inputted into the low pass filter, an output signal of the second class S modulator is supplied to the drain electrode of the third field effect transistor, the class B amplifier amplifies and outputs a high frequency component of the input signal from the sixth operational amplifier, and the first class S modulator amplifies and supplies a low frequency components of the input signal from the sixth operational amplifier.

12. The amplifier according to claim 11, wherein an output voltage of the Schmidt circuit is either positive represented by the power supply voltage or 0 represented by the grounding voltage, and when the output voltage of the Schmidt circuit is positive, an output voltage of the integrating circuit decreases in a constant slope, when the output voltage of the integrating circuit is lower than a threshold voltage of the Schmidt circuit, the output voltage of the Schmidt circuit is 0 and the output voltage of the integrating circuit increases in a constant slope, and when the output voltage of the integrating circuit is higher than the threshold voltage of the Schmidt circuit, the output voltage of the Schmidt circuit is positive and the output voltage of the integrating circuit decreases in a constant slope.

13. The amplifier according to claim 11, wherein the input voltage from the oscillator is a triangular wave, and the first field effect transistor turn on or turn off in a cycle of the triangular wave, the lower the input voltage from the low pass filter, the longer the period in which the input voltage from the oscillator is higher in one cycle of the triangular wave, and the longer the period in which the first field effect transistor is off, and the higher the input voltage from the low pass filter, the longer the period in which the input voltage from the oscillator is lower in one cycle of the triangular wave, and the longer the period in which the first field effect transistor is on.

14. The amplifier according to claim 11, wherein the power supply voltage is applied to a source electrode of the first field effect transistor, and when the first field effect transistor is on, the output of the first class S modulator rises to the power supply voltage and when the first field effect transistor is off, the output of the first class S modulator falls until it is clipped by the first diode, and an output of the first class S modulator is smoothed and becomes a signal proportional to the input voltage from the low pass filter.

15. The amplifier according to claim 11, wherein an output voltage of the step-up DC—DC converter is applied to a source electrode of the second field effect transistor, and when the second field effect transistor is on, the output of the second class S modulator rises to the output voltage of the step-up DC—DC converter and when the second field effect transistor is off, the output of the second class S modulator falls until it is clipped by the second diode, and an output of the second class S modulator is smoothed and becomes a signal proportional to the input voltage from the low pass filter.

16. The amplifier according to claim 11, wherein a level of a signal resulting from smoothing of an output of the second class S modulator is times a level of a signal resulting from smoothing of an output of the first class S modulator, where j is assumed to be the step-up ratio of the step-up DC—DC converter.

17. The amplifier according to claim 11, wherein the third and fourth diodes are level shift diodes, which shift a signal voltage by equivalents of threshold voltages of the third and fourth transistors.

18. The amplifier according to claim 11, wherein the input voltage from the oscillator is a triangular wave, and the fifth field effect transistor turn on or turn off in a cycle of the triangular wave, the higher the input voltage from the eighth operational amplifier, the longer the period in which the input voltage from the oscillator is lower in one cycle of the triangular wave, the longer the period in which the fifth field effect transistor is off, and the higher an output voltage of the step-up DC—DC converter, and the lower the input voltage from the eighth operational amplifier, the longer the period in which the input voltage from the oscillator is higher in one cycle of the triangular wave, the longer the period in which the fifth field effect transistor is on, and the lower the output voltage of the step-up DC—DC converter.

19. A radio frequency power amplifier, comprising:

a carrier amplifier for amplifying a radio frequency signal to be inputted by operating near or in saturation; and an envelope amplifier for amplifying an envelope of the radio frequency signal and outputting an output signal after amplification as a power supply voltage of the carrier amplifier, wherein the envelope amplifier comprises a DC—DC converter for amplifying a low frequency component of the envelope of the radio frequency signal and a class B amplifier for amplifying the envelope of the radio frequency signal and outputting a high frequency component after amplification, and the DC—DC converter and the class B amplifier are connected in parallel and a power supply voltage of the class B amplifier is controlled with the low frequency component.

20. A radio frequency power amplifier, comprising:

a carrier amplifier for amplifying a radio frequency signal to be inputted by operating near or in saturation; and a power supply voltage control circuit, into which a power supply voltage control signal is inputted, for generating a power supply voltage of the carrier amplifier, wherein the power supply voltage control circuit comprises a DC—DC converter for amplifying a low frequency component of the power supply voltage control signal and a class B amplifier for amplifying the power supply voltage control signal and outputting a high frequency component after amplification, and the DC—DC converter and the class B amplifier are connected in parallel and a power supply voltage of the class B amplifier is controlled with the low frequency component.

* * * * *